United States Patent [19]

Reele

[11] Patent Number: 5,408,122

[45] Date of Patent: Apr. 18, 1995

[54] VERTICAL STRUCTURE TO MINIMIZE SETTLING TIMES FOR SOLID STATE LIGHT DETECTORS

[75] Inventor: Samuel Reele, Rochester, N.Y.

[73] Assignee: Eastman Kodak Company, Rochester, N.Y.

[21] Appl. No.: 160,566

[22] Filed: Dec. 1, 1993

[51] Int. Cl.⁶ .................... H01L 27/14; H01L 31/00
[52] U.S. Cl. ............................... 257/446; 257/448; 257/452; 257/459
[58] Field of Search ............... 257/431, 446, 448, 452, 257/457, 459, 461, 438

[56] References Cited

U.S. PATENT DOCUMENTS

| | | | |
|---|---|---|---|
| 3,117,260 | 1/1964 | Noyce | 317/235 |
| 3,335,341 | 8/1967 | Lin | 317/235 |
| 3,694,276 | 9/1972 | Wakamiya | 43/60.713 |
| 3,767,486 | 10/1973 | Imaizumi | 148/175 |
| 3,775,196 | 11/1973 | Wakamiya | 148/175 |
| 3,971,059 | 7/1976 | Dunkley et al. | 357/44 |
| 4,295,898 | 10/1981 | Yoshida et al. | 148/1.5 |
| 4,435,610 | 3/1984 | Perlman et al. | 136/255 |
| 4,794,443 | 12/1988 | Tanaka et al. | 257/446 |
| 4,811,071 | 3/1989 | Roloff | 357/34 |
| 4,866,401 | 9/1989 | Terasima | 330/310 |
| 4,887,141 | 12/1989 | Bertotti et al. | 357/36 |
| 4,890,149 | 12/1989 | Bertotti et al. | 357/48 |
| 4,891,682 | 1/1990 | Yusa et al. | 357/30 |
| 4,982,245 | 1/1991 | Hanaoka et al. | 357/15 |
| 5,021,860 | 6/1991 | Bertotti et al. | 357/48 |

FOREIGN PATENT DOCUMENTS 2-196463  8/1990  Japan ..................... 257/446

*Primary Examiner*—Jerome Jackson
*Assistant Examiner*—Donald L. Monin, Jr.
*Attorney, Agent, or Firm*—Edward Dugas

[57] ABSTRACT

A vertical semiconductor radiation detector structure is described in which a suction diode, formed by deposition of p+ on a substrate or epitaxial layer and subsequent up-diffusion during epitaxial layer deposition, surrounds the active area of the radiation detector. The suction diode removes the slow diffusion currents thereby reducing the settling time of the radiation detector to an acceptable level.

2 Claims, 4 Drawing Sheets

VERTICAL STRUCTURE TO MINIMIZE SETTLING TIMES FOR SOLID STATE LIGHT DETECTORS

FIELD OF INVENTION

This invention relates generally to the interaction between an optical storage disc and the read/write head in optical information storage systems and, more particularly, to the devices used in the detection of (reflected) radiation in these systems.

BACKGROUND OF THE INVENTION

In applications involving the interaction of a radiation beam with an optical storage medium, severe requirements are placed on the radiation detectors used in the focusing on and the tracking of information on the disk. In FIG. 1, a block diagram of the system for optical interaction with a storage medium in which the present invention can be used advantageously is shown. A current source 11 provides a current, $I_{Laser}$, to laser diode 12. The radiation from laser diode 12 is reflected from the storage medium 13, typically an optical disk, and detected by radiation detector diode 14. The (radiation) detector (diode) 14 controls the current through measuring device 15. The detector 14 is typically comprised of a plurality of individual radiation sensitive diodes A, B, ... N. For purposes of discussion, only two diodes A and B will be described, the extension to more than two diodes will be apparent. In FIG. 2A and FIG. 2B, the definitions of the critical parameters of the detector 14 output current are illustrated. In FIG. 2A, the radiation pulse applied to the detector rises from a 'read' power level of 0.2 mw of power to approximately 2 mw of 'write' power. The pulse lasts for approximately 90 ns. As shown in FIG. 2B, in response to the pulse of radiation, the detector output current rises from an initial value of current, $I_{Read}$, to the maximum current value $I_{Write}$. In order to simplify the discussion, the value of the 'read' current in FIG. 2B has been taken to be normalized to be zero. Therefore, the current rise is $I'_{Max} = (I_{Write} - I_{Read})$. (Note that $I_{Read}$ has been normalized and is in fact equal to zero.) The output current rise time, $T_r$, is defined and the time required for the output current to rise from a value of 10% of $I'_{Max}$ to 90% of $I_{Max}$ when the pulse of radiation is applied thereto. The rise time, $T_r$, is shown in FIG. 2B. The fall time, $T_f$, is defined as the time for the output current from the radiation detector to fall from 90% of $I'_{Max}$ to 10% of $I'_{Max}$ when the radiation is removed from the radiation detector. The settling time, $T_{ss}$, is defined as the time in which the output current of the radiation detector falls from 10% of $I'_{Max}$ to ±1% of $I'_{Max}$ with respect to 'read' current value. Finally, the critical time parameter, $T_{crit}$, is defined as the period of time after the completion of the $T_{ss}$ period in which the output current must remain ±1% of $I_{Read}$ with respect to zero radiation detector output read current value (i.e., $I_{Read}$). The fall time, $T_f$, the settling time, $T_{ss}$, and the critical, $T_{crit}$, are also illustrated in FIG. 2B.

The requirements for certain optical storage and retrieval applications are that the fall time, $T_f$, should be approximately 10 ns. More importantly, the settling times, $T_{ss}$, must have a value much less than the 10 ns fall time, $T_f$. The positional accuracy for focusing and tracking of the information track require that the servo systems respond to a 1% deviation of the best focusing and/or tracking signals. The storage system responses to read and write operations require time frames of the order of 10 ns or less. With the radiation detectors currently available and with laser wavelengths of 780–830 nm, tail currents as deep as 20–45 μm in the epitaxial layer or bulk contribute adversely to the settling time. In many implementations, fall times, $T_f$, 10–15 ns are achieved with 20–45 ns of additional settling time caused by the tail currents within the non-active regions and deep within the vertical structure (in the epitaxial layer or in the substrate at vertical depths greater than the active regions).

A need has therefore been felt for a vertical structure designed to achieve the goal of settling times in the order of 5–8 ns in order for detectors to achieve fall times of 10 ns (i.e., the ratio of settling time to fall time < 1.0). This invention achieves this goal by incorporating into the detector structure a suction diode which will "dump" tail currents to ground rather than allow slow diffusion currents to persist. The suction diode surrounds the active detector regions, all sides as well as the entire underside of the vertical structure.

SUMMARY OF THE INVENTION

The present invention is directed to overcoming one or more of the problems set forth above. Briefly summarized, according to one aspect of the present invention, a solid state radiation detector can be comprised of single or multiple radiation detector elements. The cathode for the radiation is an n+ doped bulk substrate as well as an n+ doped epitaxial layer. The anodes of the detector elements are p+ diffused regions. A suction diode which completely encompasses the non-active regions of the detector elements is composed of multiple p+ regions. The multiple p+ regions are deposited at the n+ bulk substrate surface prior to epitaxial growth and are up-diffused during (multiple) epitaxial depositions. In addition, multiple p+ regions are deposited and "down" diffused completing the suction diode structure at the surface of the wafer at normal p+ depths of the detector anodes.

The structure of the suction diode(s) provides a mechanism for the removal of the slow diffusion currents (typically tail currents are shunted to ground through the suction diode rather than being processed by the focusing and tracking electronics), thereby permitting the settling time of the radiation detectors to achieve acceptable values.

These and other aspects, objects, features and advantages of the present invention will be more clearly understood and appreciated from a review of the following detailed description of the preferred embodiments and appended claims, and by reference to the accompanying drawings.

DETAILED DESCRIPTION OF THE INVENTION

Figure 1:
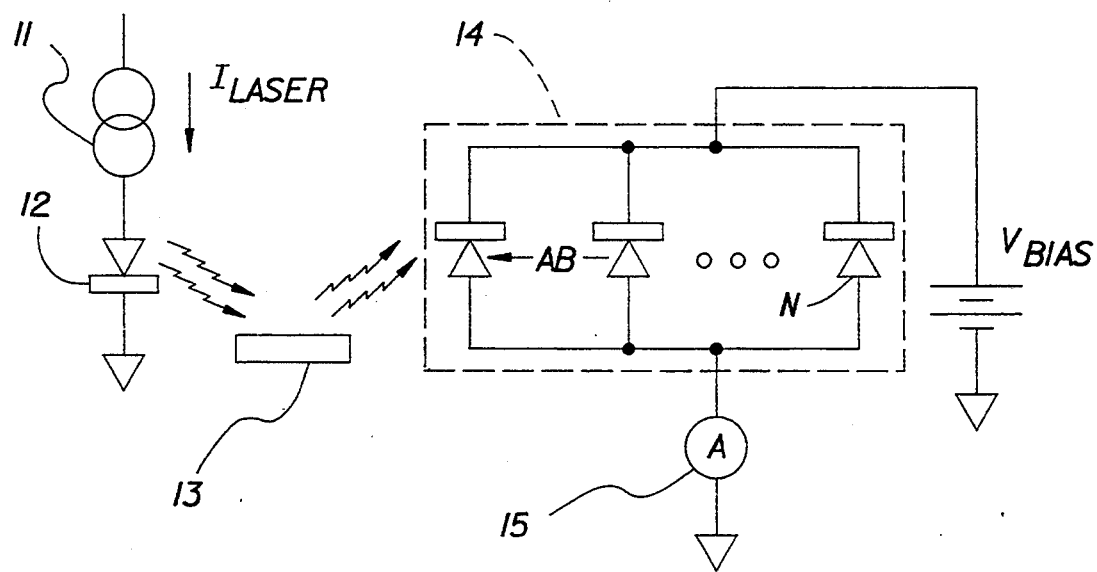
FIG. 1 is a block diagram of the system for optically interacting with an optical storage medium in which the present invention can be advantageously used.
Figure 2A:
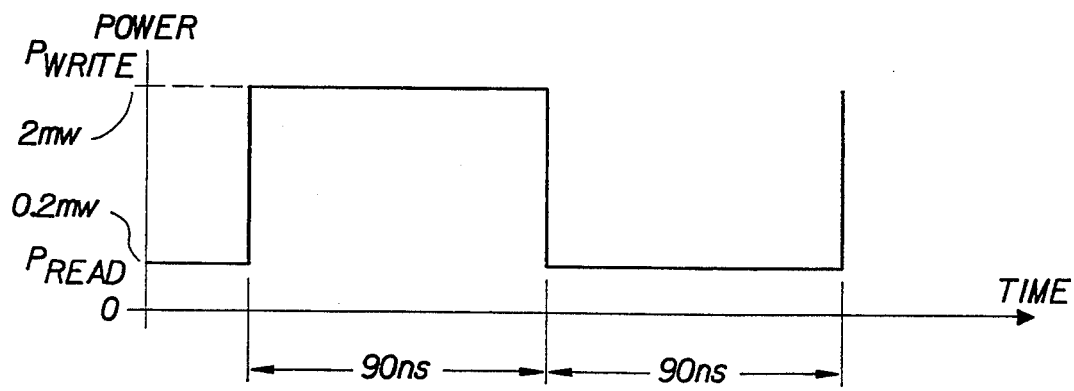
FIG. 2A illustrates a rectangular wave of radiation applied to a radiation detector.
Figure 2B:
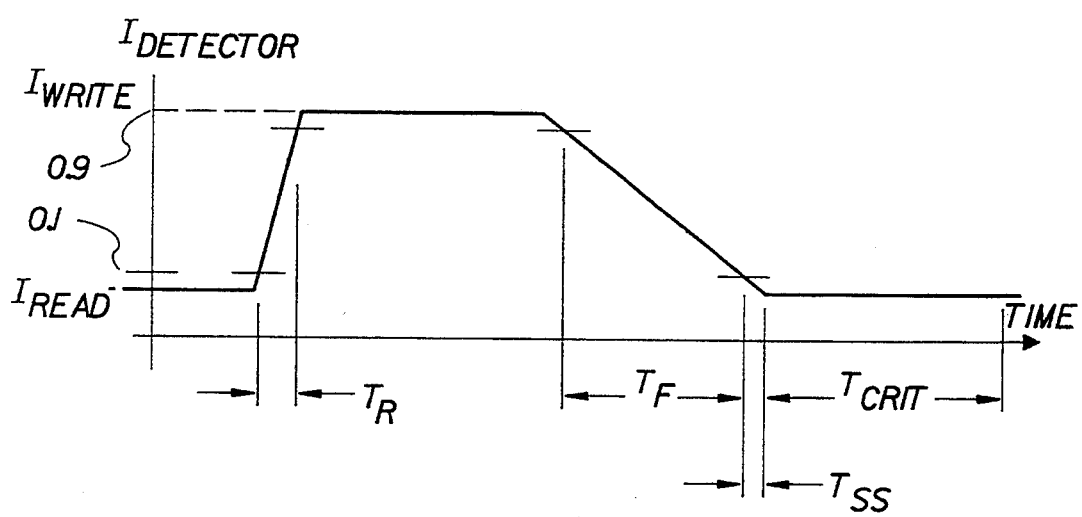
FIG. 2B illustrates the effect of the applied radiation on the output current of the radiation detector in a photoconductive mode of operation.
Figure 3:
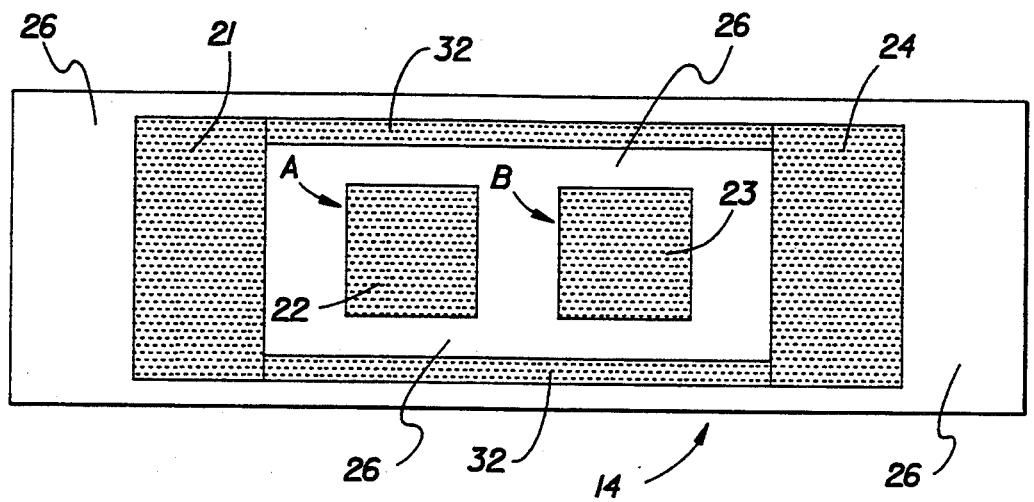
FIG. 3 is a top view of the vertical structure for minimizing settling time according to the present invention.
Figure 4:
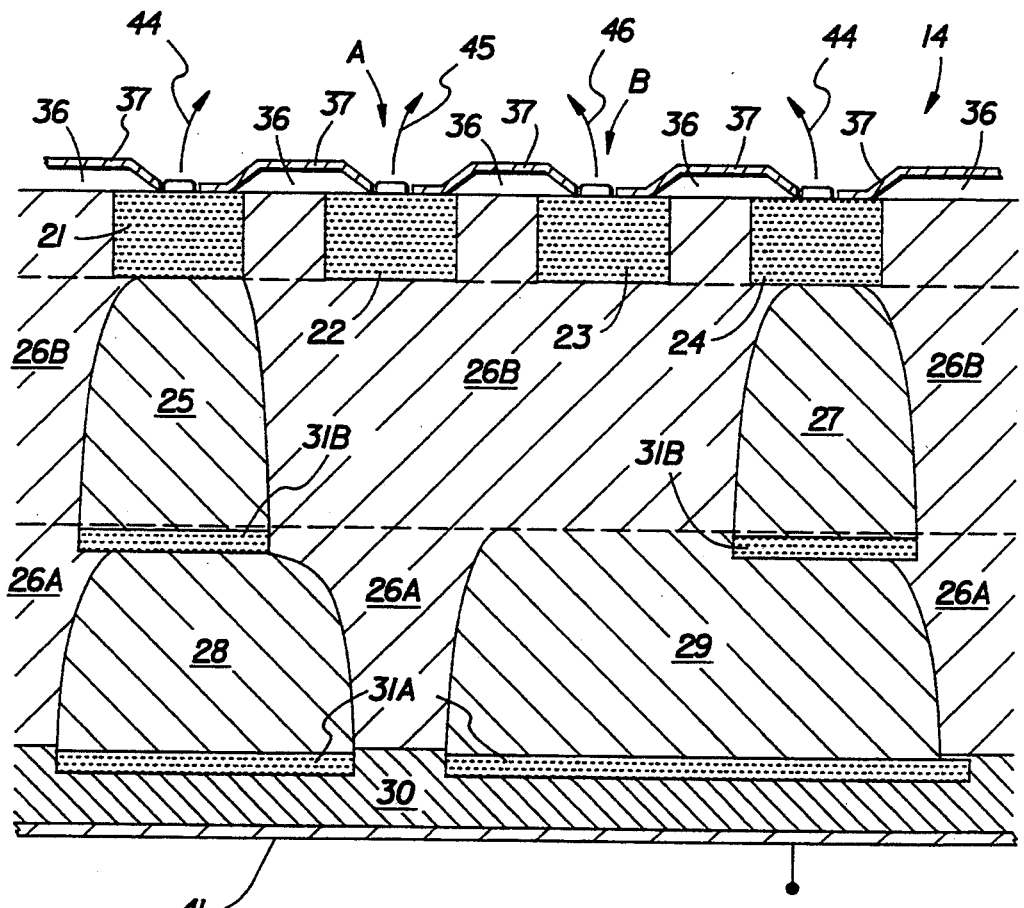
FIG. 4 is cross-sectional view of the vertical structure for minimizing settling time according to the present invention.

Referring now to FIGS. 3 and 4, wherein the lateral and vertical structure of the radiation detector according to the present invention is shown. The starting material for forming the improved radiation detector is an n-doped bulk substrate 30. Oxide cuts in the substrate 30 are used to define the foundation for two p+ regions 28 and 29. These regions will be part of the suction diode. In the defined p+ regions, a p+ dopant ion implant 31A is deposited. Next, an epitaxial region 26A is grown. The p+ regions 28 and 29 form initial sections of a continuous suction diode fabricated by an updiffusion process during standard epitaxial growth. For a thick epitaxial layer, a second set of oxide cuts are used to define a second group of p+ regions 25 and 27. The second group of regions has p+ dopant ion implants 31B deposited mostly on the p+ regions 28 and 29 and somewhat on the epitaxial layer 26A. Regions 25 and 27 form contiguous sections of the suction diode by the updiffusion process during standard epitaxial growth. The defining of the p+ regions and the depositing of the p+ dopant ion implants can be continued until the second epitaxial layer 26B has achieved the desired thickness. The thickness of the individual epitaxial layers can be limited by the requirement that p+ (updiffused) wells exist within standard junction depths of the p+ active detector regions from the surface when the p+ active regions are deposited and diffused. Once the total epitaxial region thickness is obtained, oxide windows 22 and 23 for p+ active detector regions are established as well as top sections 21, 24, and 32 of the suction diode. Next, p+ dopant is deposited in the oxide windows 21, 22, 23, 24. The p+ ions in the windows 21, 22, 23, 24 and 26 are diffused. An insulating oxide 36 is applied to electrically isolate the exposed anodes of the detector 14. The anodes have conducting materials and conducting leads applied thereto, i.e., 44 for the suction diodes and 45 for detector diode A and 46 for detector diode B. A nitride layer 37 can be added for passivation, to serve as an anti-reflection coating. A metal layer 41 is formed on substrate 30 which is the cathode of the detector 14 to provide convenient electrical access to the detector.

Figure 5:
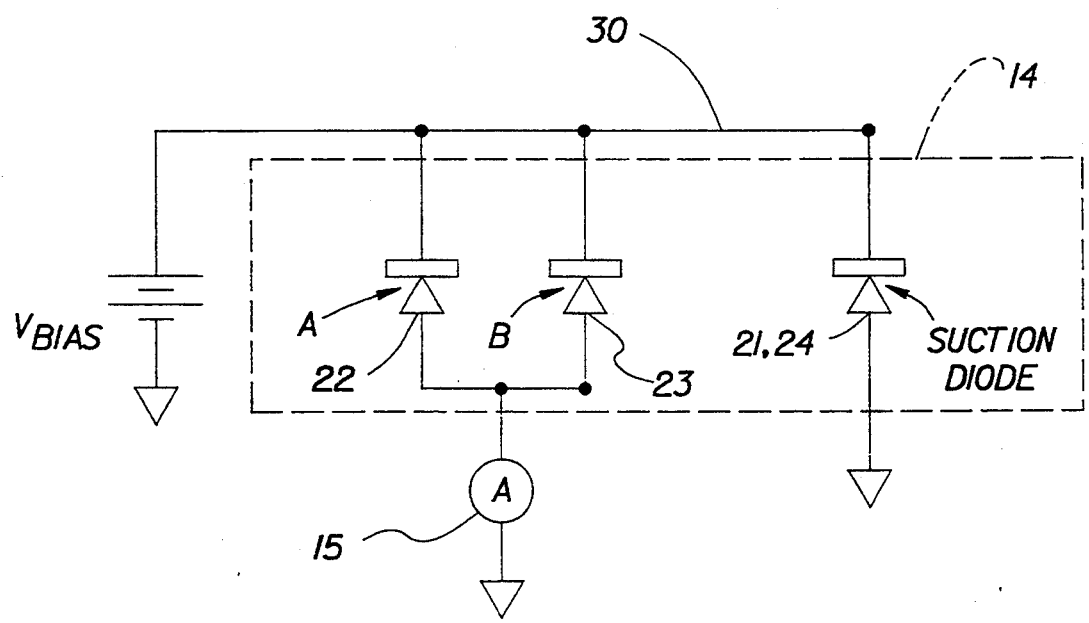
FIG. 5 is a schematic representation of the detector including the suction diode of FIGS. 3 and 4.

It will be now appreciated that there has been presented a vertical structure in which a suction diode is fabricated along with two radiation detector diodes. The suction diode is used to remove the slow transient currents which would otherwise compromise the settling time of the radiation detectors diodes. A schematic representation of FIGS. 3 and 4 is shown in FIG. 5. Diode A and diode B are the radiation detector diodes which control the current through the measuring device 15. However, the current which passes through the suction diode is applied to ground. Diode anodes 21 and 24 and the p+ areas 25, 27, 28 and 29 electrically coupled thereto and the cathode 30 form the suction diode. The structure of the suction diode is such that the radiation detector completely surrounded on the sides and is substantially surrounded on the bottom by the suction diode. This configuration provides a short (quick) electrical path for tailing currents through the epitaxial layers 26A and 26B to the cathode 30 and ground in the system.

Operation of the present invention is believed to be apparent from the foregoing description and drawings, but a few words will be added for emphasis. The suction diode is fabricated with process steps which are compatible with the fabrication of the radiation detector. Whether a single epitaxial layer is used or a plurality of epitaxial layers are required to provide an acceptable radiation diode, the process for fabrication of the suction diode is compatible with both the single or multiple epitaxial layers.

While the invention has been described with particular reference to a preferred embodiment, it will be understood by those skilled in the art that various changes may be made and equivalents may be substituted for elements of the preferred embodiment without departing from invention. In addition, many modifications may be made to adapt a particular situation and material to a teaching of the invention without departing from the essential teachings of the present invention.

As is evident from the foregoing description, certain aspects of the invention are not limited to the particular details of the examples illustrated, and it is therefore contemplated that other modifications and applications will occur to those skilled in the art. It is accordingly intended that the claims shall cover all such modifications and applications as do not depart from the true spirit and scope of the invention.

Parts List 21 p+ diffused region (part of suction diode anode)
22 p+ diffused active area (anode of detector element "A")
23 p+ diffused active area (anode of detector element "B")
24 p+ diffused region (part of suction diode anode)
25 p+ diffused region (part of suction diode anode)
26 epitaxial growth regions
26A (first) epitaxial growth region (cathode of active detector element and suction diode)
26B (second) epitaxial growth region (cathode of active detector element and suction diode)
27 p+ diffused region (part of suction diode anode)
28 p+ diffused region (part of suction diode anode)
29 p+ diffused region (part of suction diode anode) bulk substrate (detector elements cathodes and suction diode cathode)
31A (first) p+ dopant ion region (for suction diode up-diffusion)
31B (second) p+ dopant ion region (for suction diode up-diffusion)
32 Oxide window
36 insulating oxide
37 nitride layer
41 metal cathode
44 metal anode and conducting lead for the suction diode
45 metal anode and conducting lead for detector element A
46 metal anode and conducting lead for detector element B

What is claimed is:

1. A semiconductor radiation detector of the type having a substrate acting as a cathode for the radiation detector, an epitaxial deposition layer formed on the substrate for providing a cathode element for said radiation detector, and a first electrode providing an anode for said radiation detector formed on a surface of said epitaxial layer, said radiation detector being characterized by a vertical diode comprising:

a well of p+ material extending from said substrate into said epitaxial layer and substantially surrounding said radiation detector; and a second electrode providing an anode for the vertical diode, said second electrode substantially surrounding said first electrode and electrically coupled to the well of p+ material with said substrate forming the cathode of the vertical diode.

2. A radiation detector comprising:

an n-doped bulk substrate acting as a cathode element for said radiation detector;

at least one epitaxial layer deposited on said n-doped bulk substrate;

a p+ doped well extending from a portion of the said n-doped bulk substrate to surround a portion of the epitaxial layer;

at least one radiation sensor formed in the portion of the epitaxial layer surrounded by said p+ doped well; and a diffused active area, deposited on the p+ doped well furthest from the n-doped bulk substrate, acting as an anode and in conjunction with the n-doped bulk substrate acting as a cathode element to form a vertical diode.

* * * * *